United States Patent
Yu et al.

(10) Patent No.: US 9,080,817 B2
(45) Date of Patent: Jul. 14, 2015

(54) METHOD FOR MANUFACTURING TWO-PHASE HEAT EXCHANGE DEVICE

(75) Inventors: Min-Hui Yu, Taoyuan Hsien (TW); Chi-Feng Lin, Taoyuan Hsien (TW); Chin-Ming Chen, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 767 days.

(21) Appl. No.: 13/291,267

(22) Filed: Nov. 8, 2011

(65) Prior Publication Data

US 2012/0047739 A1  Mar. 1, 2012

Related U.S. Application Data

(60) Division of application No. 12/142,381, filed on Jun. 19, 2008, now abandoned, which is a continuation-in-part of application No. 11/493,650, filed on Jul. 27, 2006, now abandoned.

(30) Foreign Application Priority Data

Nov. 4, 2005 (TW) ............................... 94138665 A
Jun. 22, 2007 (TW) ............................... 96122438 A

(51) Int. Cl.
| | |
|---|---|
| *B23P 6/00* | (2006.01) |
| *F28D 15/02* | (2006.01) |
| *B23P 15/26* | (2006.01) |
| *F28D 15/04* | (2006.01) |
| *H01L 23/427* | (2006.01) |
| *F28F 1/14* | (2006.01) |
| *F28F 1/24* | (2006.01) |

(52) U.S. Cl.
CPC ............. *F28D 15/0283* (2013.01); *B23P 15/26* (2013.01); *F28D 15/046* (2013.01); *H01L 23/427* (2013.01); *F28F 1/14* (2013.01); *F28F 1/24* (2013.01); *H01L 2924/0002* (2013.01); *Y10T 29/49353* (2015.01)

(58) Field of Classification Search
CPC ...... B21C 37/24; B21D 53/02; B21D 53/085; B23P 15/26; H01L 23/427; F28D 15/0283; F28D 15/046; F28F 1/24; F28F 1/14; Y10T 29/49353
USPC ......... 29/890.03, 890.031, 890.032, 890.045, 29/890.046, 890.054; 165/80.2, 80.3, 165/104.21, 104.26
See application file for complete search history.

(56) References Cited

U.S. PATENT DOCUMENTS

| | | |
|---|---|---|
| 2,883,591 A | 4/1959 | Camp |
| 3,595,304 A | 7/1971 | McHugh |
| 3,681,843 A | 8/1972 | Arcella et al. |
| 3,750,745 A | 8/1973 | Moore, Jr. |
| 3,840,069 A | 10/1974 | Fischer et al. |

(Continued)

*Primary Examiner* — Ryan J Walters
(74) *Attorney, Agent, or Firm* — Muncy, Geissler, Olds & Lowe, P.C.

(57) ABSTRACT

A method for manufacturing a two-phase heat exchange device is provided. The method includes the steps of providing a container having an opening and a first wick structure disposed on the inner surface thereof, adding a predetermined material into the container, providing an cover and joining the cover with the container to construct a main body of the two-phase heat exchange device, wherein the cover seals the opening to form a closed space within the main body, and forming a second wick structure on the inner surface of the cover, wherein the first and second wick structures form a continuous structure covering the entire inner surface of the main body.

6 Claims, 6 Drawing Sheets

(56) References Cited

U.S. PATENT DOCUMENTS

| | | |
|---|---|---|
| 4,011,104 A | 3/1977 | Basiulis |
| 4,196,504 A | 4/1980 | Eastman |
| 4,253,515 A * | 3/1981 | Swiatosz ................ 165/61 |
| 5,412,535 A | 5/1995 | Chao et al. |
| 6,938,680 B2 | 9/2005 | Garner et al. |
| 6,994,152 B2 | 2/2006 | Rosenfeld et al. |
| 2007/0267179 A1 | 11/2007 | Hou et al. |

* cited by examiner

METHOD FOR MANUFACTURING TWO-PHASE HEAT EXCHANGE DEVICE

CROSS REFERENCE TO RELATED APPLICATIONS

This application is a Divisional of application Ser. No. 12/142,381, filed on Jun. 19, 2008, which is a Continuation-in-part of application Ser. No. 11/493,650 filed on Jul. 27, 2006, and the entirety of which is incorporated by reference herein.

BACKGROUND OF THE INVENTION

1. Field of the Invention

The present invention relates in general to heat dissipation apparatuses, and in particular to heat dissipation apparatuses with a two-phase heat exchange devices and manufacturing methods thereof, capable of increasing heat dissipation efficiency.

2. Description of the Related Art

With the performance of electronic devices becoming higher, cooling devices or systems are applied thereto for heat dissipation, preventing from overheating failure of the electronic devices. When dimensions of the integrated circuits decrease, heat accumulation of the integrated circuits accordingly increases. Therefore, highly efficient cooling devices are particularly significant for micro-electronic devices, such as integrated circuits (ICs).

A heat column is a conventional heat dissipation apparatus having a small contact area without requiring external driving forces. FIGS. 1A and 1B depict two conventional types of heat pipes. The heat pipe 10 of FIG. 1A is produced by disposing a wick structure 131 on an inner surface of a container 12. Subsequently, an end cap 11 is mounted on the container 12, and a working fluid w is filled into the container 12 through a fill tube 14. Finally, the container 12 is vacuumed and the fill tube 14 is sealed. Specifically, no wick structure is disposed on the surface of the end cap 11, as shown in FIG. 1A, and only the wick structure 131 on the inner surface of the container 12 forms a heat transferring area. Therefore, the effective heat transferring area is small.

With respect to another heat pipe 10 shown in FIG. 1B, though the end cap 11 has a wick structure 132, which is formed by a porous plate, disposed on the inner surface of the end cap 11, the wick structures 131 and 132 are still two separated structures and lead to discontinuous capillary pumping force of the working fluid w. That is, the condensed working fluid w within the wick structure 132 cannot smoothly flow back into the wick structure 131, thus decreasing heat dissipation efficiency thereof.

BRIEF SUMMARY OF THE INVENTION

To solve aforementioned problems, a heat dissipation apparatus, a two-phase heat exchange device and manufacturing methods thereof are provided, for preventing reduced capillary pumping force caused by discontinuous conventional wick structures, and facilitating high heat transferring efficiency and cyclic flow of a working fluid.

The present invention provides a two-phase heat exchange device including a main body and a continuous wick structure. The main body forms a closed space therein, and the continuous wick structure is disposed on the entire inner surface of the main body.

The present invention further provides a method for manufacturing a two-phase heat exchange device. The method includes the steps of providing a container having an opening and a first wick structure disposed on the inner surface thereof, adding a predetermined material into the container, providing an cover and joining the cover with the container to construct a main body of the two-phase heat exchange device, wherein the cover seals the opening to form a closed space within the main body, and forming a second wick structure on the inner surface of the cover, wherein the first and second wick structures form a continuous structure covering the entire inner surface of the main body.

The present invention further provides a heat dissipation apparatus including a plurality of fins and the above-mentioned two-phase heat exchange device connected to the fins.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
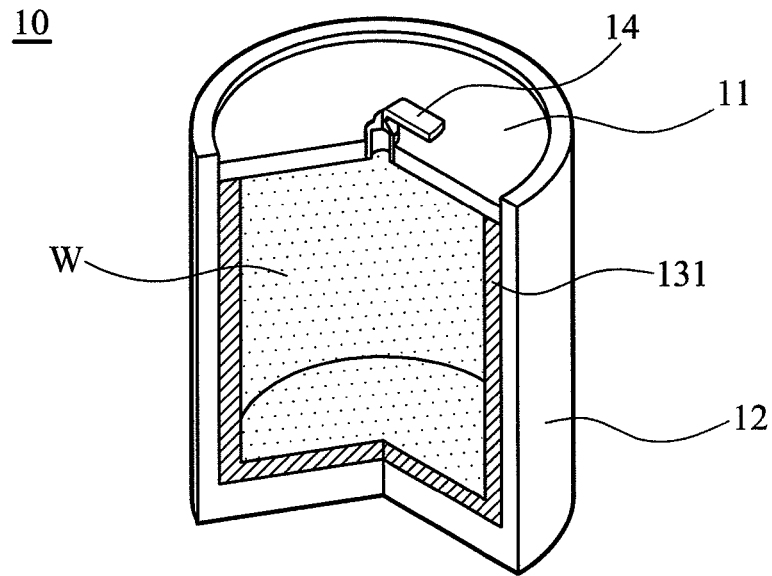
FIGS. 1A and 1B are schematic illustrations showing the cross-sections of the conventional heat pipes.
Figure 1B:
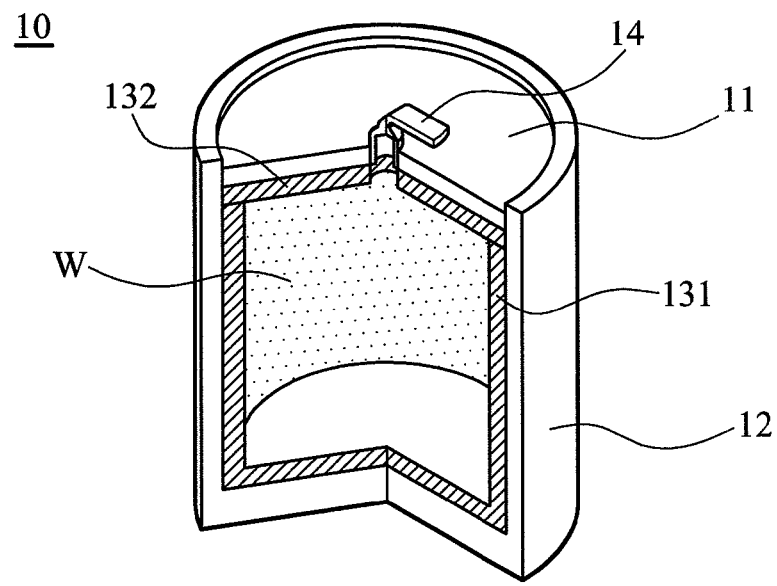
Figure 2A:
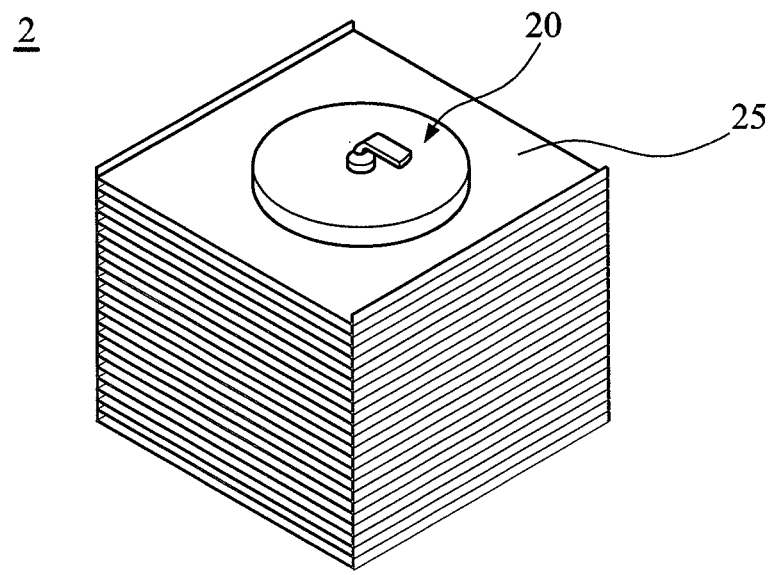
FIG. 2A is a schematic illustration of an embodiment of a heat dissipation apparatus.
Figure 2B:
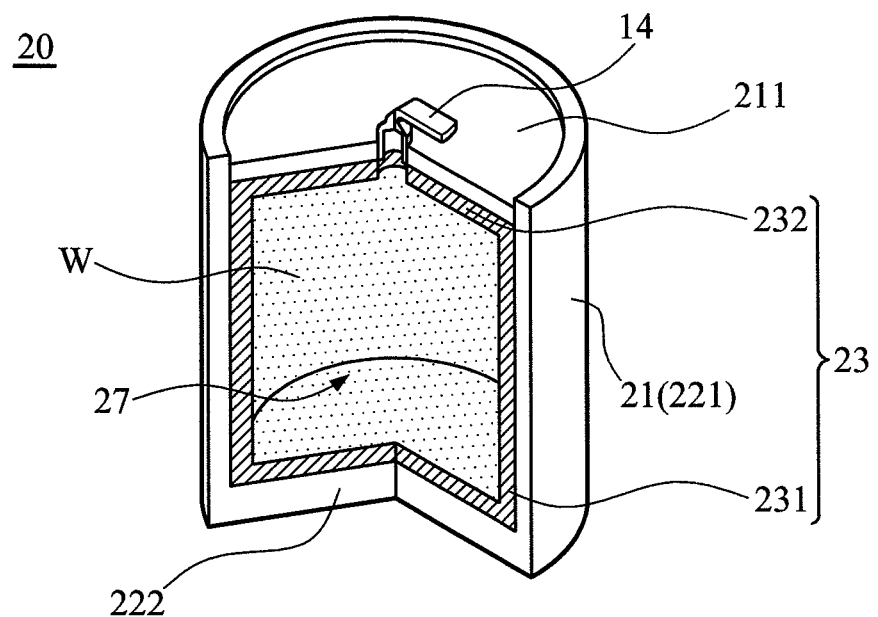
FIG. 2B is a schematic illustration showing the inner structure of the two-phase heat exchange device in FIG. 2A.

Referring to FIGS. 2A and 2B, an embodiment of a heat dissipation apparatus 2 includes a two-phase heat exchange device 20 and a plurality of fins 25. As shown in FIG. 2B, the two-phase heat exchange device 20, such as a heat pipe, includes a main body 21 and a continuous wick structure 23. The continuous wick structure 23 and the main body 21 have high thermal conductivity. The main body 21 includes a container 22 and a cover 211, wherein the container 22 includes a lateral wall 221 and a bottom portion 222, which are two individual components connected to each other, or integrally formed as a single piece. The continuous wick structure 23 is disposed on the entire inner surface of the main body 21, and the fins 25 surround the two-phase heat exchange device 20.

Figure 3A:
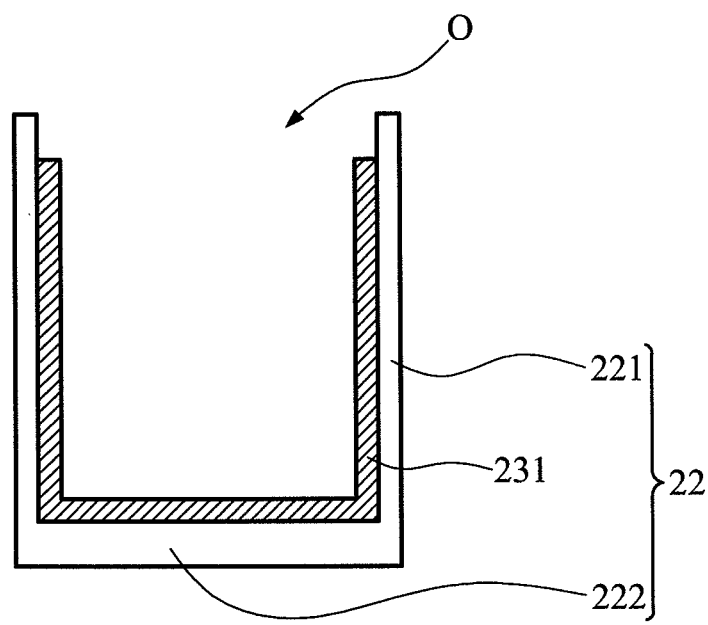
FIGS. 3A-3F illustrate sequential process steps for manufacturing the two-phase heat exchange device in FIG. 2B.
Figure 3B:
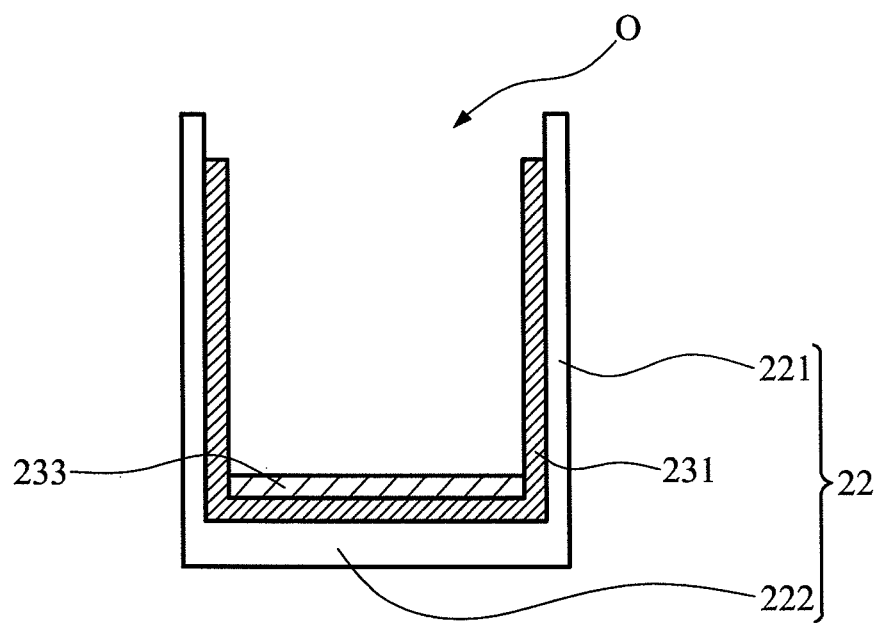
Figure 3C:
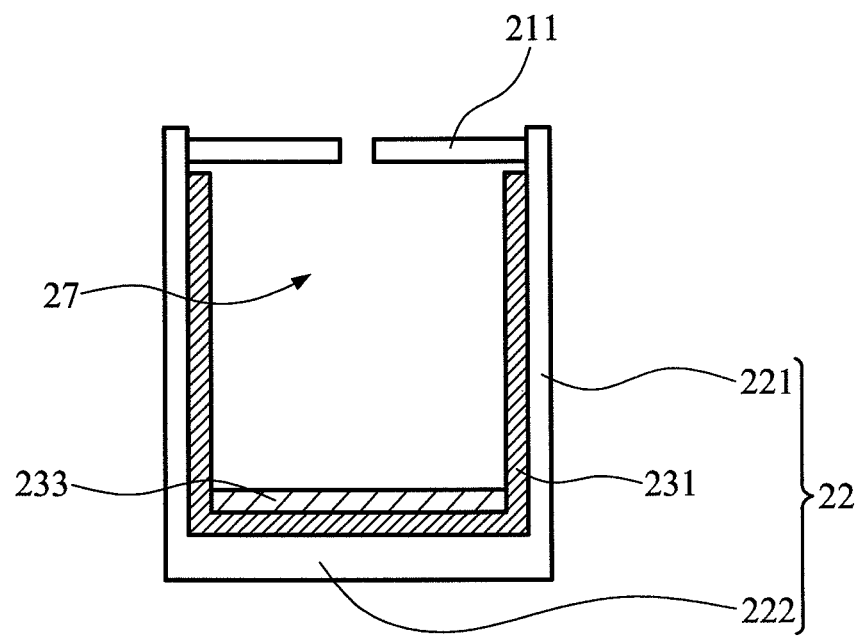

FIGS. 3A-3F illustrate sequential process steps for manufacturing the two-phase heat exchange device 20 in FIG. 2B. Firstly, as shown in FIG. 3A, a container 22 having an opening o is provided, wherein a first wick structure 231 is formed on an inner surface of the container 22 by powder sintering. Subsequently, as shown in FIG. 3B, a predetermined material, such as a plurality of sintering particles 233, is put on the first wick structure 231 through the opening o, wherein the sintering particles 233 and the first wick structure 231 may include metal, alloy or combinations thereof. As shown in FIG. 3C, the main body 21 is constructed by joining the cover 211 with the container 22.

Figure 3D:
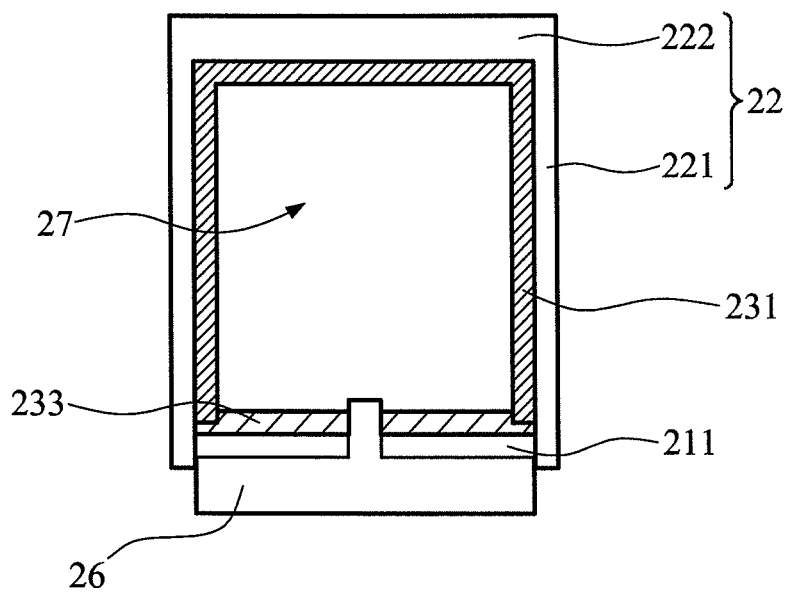
Figure 3E:
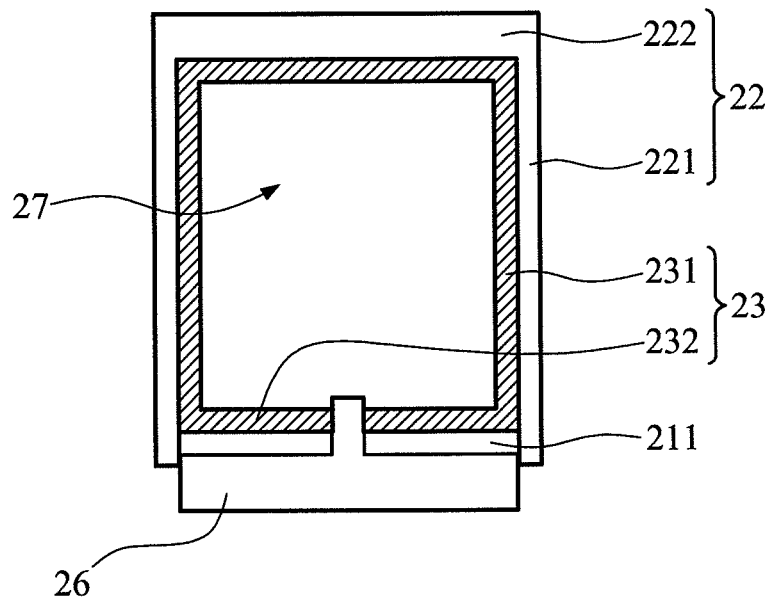

The main body 21 is inverted upside down with a sintering mold 26 mounted on the cover 211, as shown in FIG. 3D, wherein a closed space 27 is formed in the main body 21. Here, the main body 21 can be shook for a while so that the sintering particles 233 averagely fall on the inner surface of the cover 211. The next step is sintering the main body 21, wherein the sintering particles 233 on the inner surface of the cover 211 form the second wick structure 232, as shown in FIG. 3E. Since the sintering particles 233 (the second wick structure 232) and the first wick structure 231 have similar composition, they can form a continuous and identical wick structure 23 (FIG. 3E) around the inner surface of the main body 21.

Figure 3F:
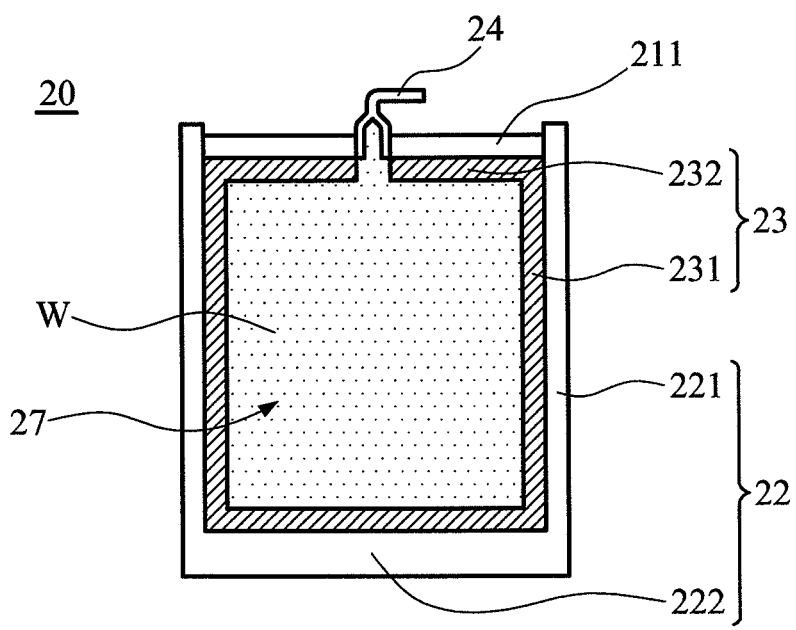

When sintering is finished, the mold 26 is removed from the cover 211, and a fill tube 24 is installed to the cover 211. As shown in FIG. 3F, the main body 20 is filled with working fluid w via the fill tube 24. In this embodiment, the working fluid w can be inorganic compound, pure water, alcohol, ketone, liquid metal, coolant, organic compound, or combinations thereof. Hence, completing the manufacturing process of the two-phase heat exchange device 20. Furthermore, a plurality of fins 25 may be mounted on the outer surface of the two-phase heat exchange device 20 by press-fitting or welding, to form the heat dissipation apparatus 2 shown in FIG. 2A.

The heat dissipation apparatus 2 can be applied to an electronic device generating heat, such as a CPU, transistor, server, graphic card, hard disk, power supply, traffic control system, multimedia electronic device, wireless base station, or video game player. When using the heat dissipation apparatus 2, the main body 21 thereof can be directly in contact with a heat source or connected to the heat source via a base, such as a solid metal block, to dissipate heat from the heat source.

In some embodiments, the continuous wick structure 23 may include metal spring shaped, grooved, pillared, meshed, sintered porous material or combinations thereof. Since the continuous wick structure 23 covers the entire inner surface of the main body 21 and is integrated into a continuous wick structure, which is identical compositions and textures, discontinuity and reduction of capillary pumping force are prevented, and thermal efficiency thereof is improved.

Moreover, the bottom portion 222, the lateral wall 221, and the cover 211 may include material of high thermal conductivity, such as aluminum, copper, titanium, molybdenum, silver, stainless steel, carbon steel, or alloy, facilitating heat transfer from the two-phase heat exchange device 20 to the fins 25, such that heat is rapidly dissipated via the fins 25 by convection.

Figure 4:
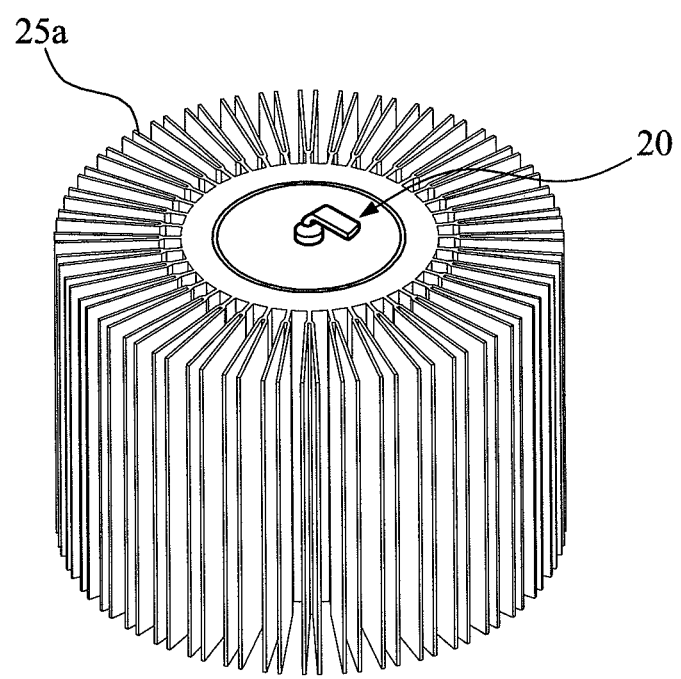
FIG. 4 is a schematic illustration of another embodiment of a heat dissipation apparatus.

In some embodiments, the two-phase heat exchange device 20 can be a vertical heat column, flattened heat pipe, flat plate heat pipe, or horizontal heat column, and the main body 21 thereof can have a circular, triangular, square, trapezoid, or polygonal cross-section. The wick structure 23 can be formed in the two-phase heat exchange device 20 in various formations regardless of the profile of the main body 21, facilitating high heat dissipating efficiency. Further, the fins 25 can be arranged horizontally with respect to the two-phase heat exchange device 20 and stacked together as shown in FIG. 2A, or the fins 25a can be arranged radially around the two-phase heat exchange device 20 as shown in FIG. 4.

The present invention provides a heat dissipation apparatus and manufacturing method thereof. The heat dissipation apparatus has a continuous wick structure, preventing discontinuity and reduction of capillary pumping force to make the return of the working fluid w faster, whereby facilitating high thermal efficiency and stability of electronic products.

While the present invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for manufacturing a two-phase heat exchange device, comprising steps of:
    providing a container, wherein the container has an opening and a first wick structure disposed on an inner surface thereof;
    adding a predetermined material into the container;
    providing a cover, wherein a main body of the two-phase heat exchange device is constructed by joining the cover with the container, and the cover seals the opening to form a closed space within the main body;
    inverting and shaking the main body, such that the predetermined material averagely fall on the inner surface of the cover; and
    forming a second wick structure on the inner surface of the cover, wherein the first and second wick structures form a continuous structure covering the entire inner surface of the main body.

2. The method of claim 1, wherein the first wick structure is formed on the inner surface of the container by sintering, and the predetermined material comprises a plurality of sintering particles.

3. The method of claim 2, wherein the second wick structure is formed on the inner surface of the cover by sintering the sintering particles, and the first and second wick structures form the continuous wick structure.

4. The method of claim 1, wherein a fill tube is connected to the cover, further comprising the step of:
    filling in a working fluid, wherein the working fluid is filled into the main body through the fill tube.

5. The method of claim 1, further comprising the step of connecting the two-phase heat exchange device to a plurality of fins.

6. The method of claim 5, wherein the connecting is press-fitting or welding.

* * * * *